United States Patent
Hung et al.

(10) Patent No.: US 8,638,167 B2
(45) Date of Patent: Jan. 28, 2014

(54) OPERATIONAL AMPLIFIER

(75) Inventors: Wei-Hsiang Hung, Hsinchu (TW);
Chia-Hung Lin, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 15 days.

(21) Appl. No.: 13/432,666

(22) Filed: Mar. 28, 2012

(65) Prior Publication Data
US 2012/0249246 A1    Oct. 4, 2012

(30) Foreign Application Priority Data
Mar. 29, 2011    (TW) .............................. 100110852 A

(51) Int. Cl.
*H03F 1/14*    (2006.01)
(52) U.S. Cl.
USPC .......................................................... 330/51
(58) Field of Classification Search
USPC .................................. 330/9, 51, 267, 253, 279
See application file for complete search history.

(56) References Cited

U.S. PATENT DOCUMENTS

2006/0091955 A1*    5/2006    Choi .............................. 330/260

* cited by examiner

*Primary Examiner* — Robert Pascal
*Assistant Examiner* — Khiem Nguyen
(74) *Attorney, Agent, or Firm* — Rabin & Berto, P.C.

(57) ABSTRACT

An operational amplifier includes an input stage, an output stage, an output enable switch, an internal capacitor, a coupling effect reduction circuit. The input stage provides an intermediate signal according to an input signal. The output stage, including an output node, provides a driving signal according to the intermediate signal. The output enable switch is turned on during an output enable period, having a start time point, to drive a load with the driving signal. The internal capacitor is coupled between the input stage and the output stage. The coupling effect reduction circuit, coupled between the internal capacitor and the output node or between the internal capacitor and the input stage, is turned off during an operational period starting from the start time point, to prevent coupling charge generated when the output enable switch is turned on from affecting operational voltage levels of the input stage.

4 Claims, 3 Drawing Sheets

US 8,638,167 B2

OPERATIONAL AMPLIFIER

This application claims the benefit of Taiwan application Serial No. 100110852, filed Mar. 29, 2011, the subject matter of which is incorporated herein by reference.

BACKGROUND OF THE INVENTION

1. Field of the Invention

The invention relates in general to a coupling effect reduction apparatus, and more particularly to a coupling effect reduction apparatus for reducing a charge coupling effect in an operational amplifier.

2. Description of the Related Art

In current technologies, an operational amplifier is often used as a voltage buffer that drives a load subsequently connected therefrom with a voltage. A voltage buffer generally functions with an output enable switch to perform associated timing controls. For example, when an output enable switch is turned off, an open circuit is accordingly presented between the voltage buffer and the load such that the voltage buffer is incapable of driving the load. In contrast, when the output enable switch is turned on, the voltage buffer is accordingly coupled to the load and is able to drive the load.

In practical situation, however, charge redistribution at an output node of the voltage buffer is also achieved when the switching operations, e.g. turning on or turning off, of the output enable switch take place. For a voltage buffer having an internal circuit design with a compensation capacitor or with circuit parasitic capacitance, the above occurrence of the charge redistribution could result in a coupling effect that causes a voltage of an internal node of the voltage buffer deviating from an originally designed level.

SUMMARY OF THE INVENTION

The invention is directed to a coupling effect reduction apparatus and an operational amplifier applying the same. Compared to a conventional operational amplifier, the coupling effect reduction apparatus and operational amplifier of the present invention are advantageously capable of having an operational amplifier separated from voltage redistribution and charge coupling effects achieved with switching operations, e.g. turning on or turning off, of an output enable switch, so as to prevent the voltage redistribution and charge coupling effects from affecting bias voltage levels at internal nodes of the operational amplifier.

According to an aspect of the present invention, an operational amplifier for driving a load is provided. The operational amplifier comprises an input stage, an output stage, an output enable switch, an internal capacitor, and a coupling effect reduction circuit. The input stage provides an intermediate signal according to an input signal. The output stage, comprising an output node, provides a driving signal according to the intermediate signal. The output enable switch, coupled between the output node and the load, is turned on during an enable period having a start time point to drive the load with a driving signal. The internal capacitor is coupled between the input stage and the output stage. The coupling effect reduction circuit, coupled between the internal capacitor and the output node or between the internal capacitor and the input stage, is turned off during an operational period that begins from the start time point, so as to prevent coupling charge generated when the output enable switch is turned on from affecting operational voltage levels of the input stage.

The above and other aspects of the invention will become better understood with regard to the following detailed description of the preferred but non-limiting embodiments. The following description is made with reference to the accompanying drawings.

DETAILED DESCRIPTION OF THE INVENTION

A coupling effect reduction apparatus according to an embodiment of the present invention is applied in an operational amplifier. The coupling effect reduction apparatus is capable of having the operational amplifier separated from voltage redistribution and charge coupling effects achieved with switching operations, e.g. turning on or turning off, of an output enable switch.

Figure 1:
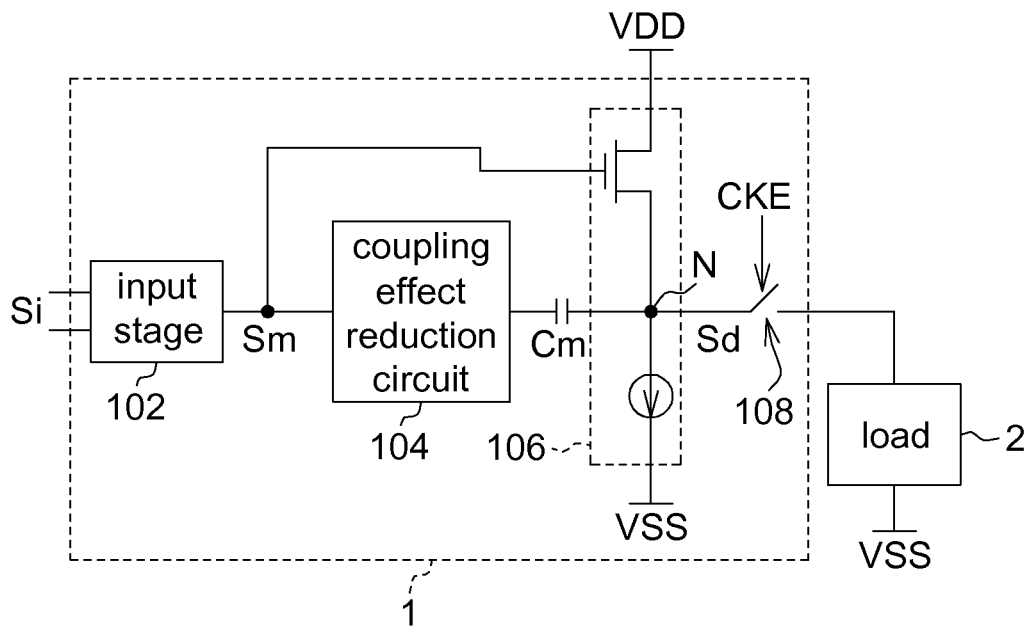
FIG. 1 is a block diagram of an operational amplifier according to an embodiment of the present invention.

FIG. 1 shows a block diagram of an operational amplifier according to an embodiment of the present invention. An operational amplifier 1, serving as an output buffer for driving a load 2, comprises an input stage 102, a coupling effect reduction circuit 104, an output stage 106, an output enable switch 108, and an internal circuit Cm. The input stage 102 provides an intermediate signal Sm according to an input signal Si. For example, the input stage 102 is a main gain stage amplifying circuit of the operational amplifier 1. The output stage 106 comprises an output node N and provides a driving signal Sd according to the intermediate signal Sm.

The internal capacitor Cm is coupled between the input stage 102 and the output stage 106. For example, the internal capacitor Cm is an internal compensation circuit of the operational amplifier 1 and is for performing capacitance compensation. In another example, the internal capacitor Cm may also be internal parasitic capacitance of the operational amplifier 1.

The output enable switch 108, coupled between the output node N and the load 2, is turned on during an output enable period TE to drive the load 2 with the driving signal Sd. The output enable period has a start time point Tx1. For example, the output enable switch 108 is controlled by a clock signal CKE to be turned on or turned off.

Figure 2:
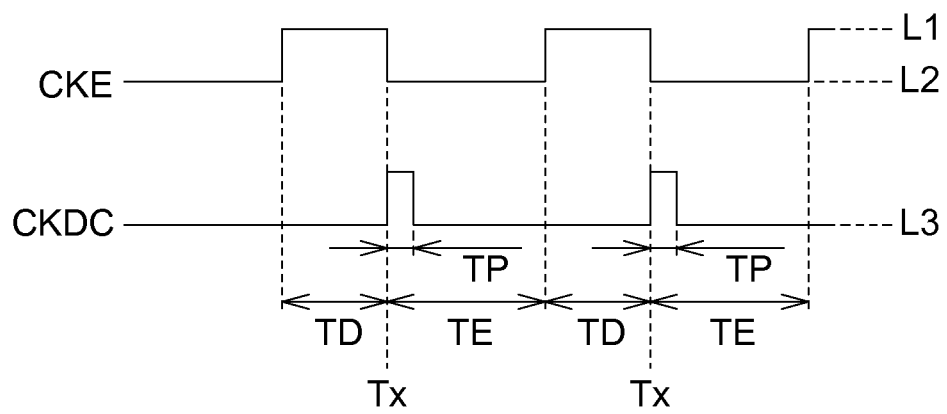
FIG. 2 is an operational timing diagram of an output enable switch 108 in FIG. 1.

FIG. 2 shows an operational timing diagram of the output enable switch 108 in FIG. 1. For example, the output enable switch 108 is a low voltage level driven switch. In the output enable period TE that begins at the start time point Tx1, the clock signal CKE corresponds to a low signal level L2 to accordingly turn on the output enable switch 108. In a disable period TD, the clock signal CKE corresponds to a high signal level L1 to accordingly turn off the output enable switch 108.

The coupling effect reduction circuit 104, coupled between the internal capacitor Cm and the input stage 102, is turned off during an operational period TP that begins from the start time point Tx1 to separate the coupling charge generated when the output enable switch 108 is turned on from the input stage 102, thereby preventing the coupling charge from affecting operational voltage levels of the input stage 102.

Figure 3:
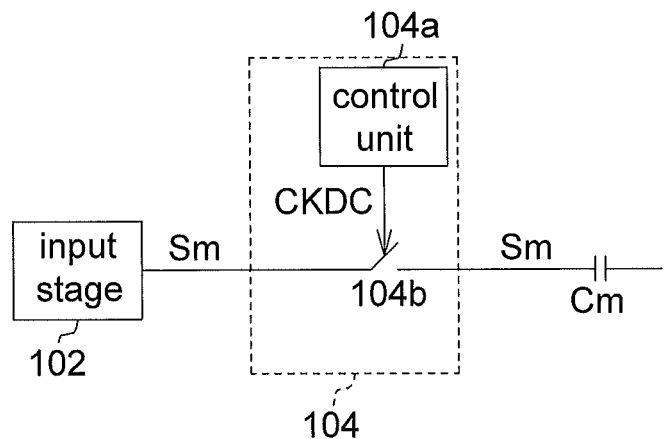
FIG. 3 is a detailed block diagram of a coupling effect reduction circuit 104 of FIG. 1.

FIG. 3 shows a detailed block diagram of the coupling effect reduction circuit 104 in FIG. 1. For example, the coupling effect reduction circuit 104 comprises a control unit 104a and a switch unit 104b. The control unit 104a may be a microprocessor or any logic circuits capable of generating a control signal CKDC according to associated timing signals. The control unit 104b provides the control signal CKDC, which corresponds to a disable level L3 during the operational period TP.

For example, the switch unit 104b comprises a control end, a first input end and a second input end. The control end receives the control signal CKDC, and the first and second input ends are respectively coupled to the internal capacitor Cm and the input stage 102. In response to the disable level L3 of the control signal CKDC, the switch unit 104b is turned off during the operational period TP. For example, the switch unit 104b is a low voltage level driven switch, with a timing diagram as shown in FIG. 2

Figure 4:
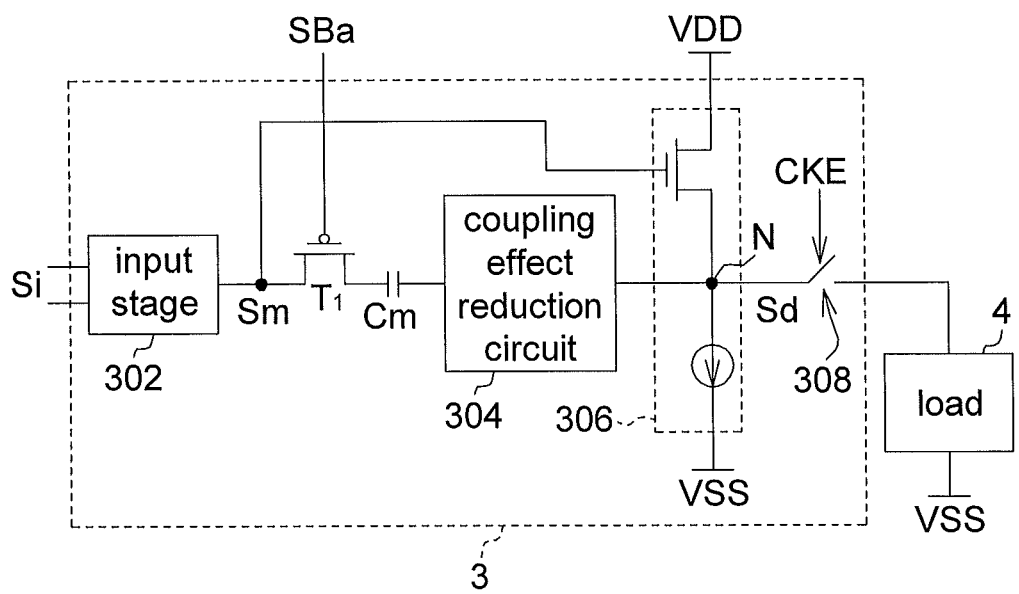
FIG. 4 is a block diagram of an operational amplifier according to another embodiment of the present invention.

In this embodiment, an example of the coupling effect reduction circuit 104, coupled between the internal capacitor Cm and the input stage 102, is given for illustrative purposes, rather than limiting the present invention. In other embodiments, a coupling effect reduction circuit 304 may also be coupled between an internal capacitor Cm and an output node N to correspondingly separate the coupling charge generated when an output enable switch 308 is turned on from an input stage 302, so as to prevent the coupling charge from affecting operational voltage levels of the input stage 302, as shown in FIG. 4. As shown, the coupling effect reduction circuit 104 in FIG. 4 may further comprise a transistor T1, which may be coupled between the input stage 102 and the internal capacitor Cm, and biased by a voltage SBa to act as a resistor.

Figure 5:
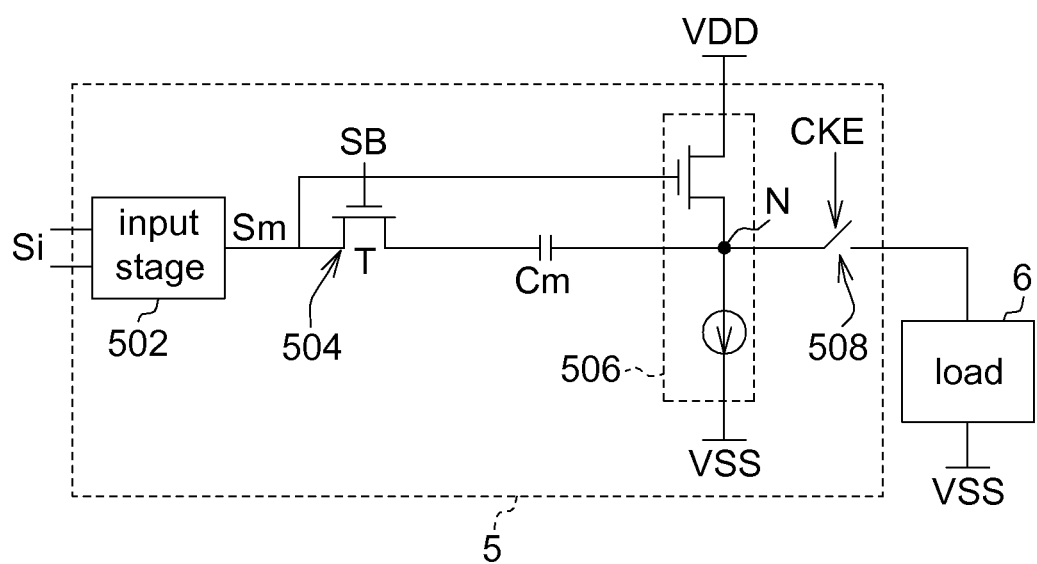
FIG. 5 is a block diagram of an operational amplifier according to yet another embodiment of the present invention.

In this embodiment, an example of the coupling effect reduction circuit 104 comprising the control unit 104a and the switch circuit 104b is given for illustrative purposes but is not to be construed as limiting the present invention. In other embodiments, a coupling effect reduction circuit 504 may be realized by a transistor T, as shown in FIG. 5. For example, the transistor T is an N-channel metal oxide semiconductor (MOS) transistor, which has its gate receiving a bias signal SB, and its drain and its source respectively coupled to an input stage 502 and an internal capacitor Cm.

A level of the bias signal SB satisfies a condition of L_SmS<L_SB<L_SmT, where L_SB is the level of the bias signal SB, L_SmT is a median voltage level of a transient-state voltage at a coupling node of the internal capacitor Cm and the transistor T when the output enable switch 508 is turned on, and L_SmS is a steady-state voltage level at the coupling node of the internal capacitor Cm and the transistor T. Accordingly, within a period of transient-state change (i.e., during the operational period TP) starting when the output enable switch 508 is turned on, the gate voltage level of the transistor T is lower than the source voltage level (L_SB<L_SmT). Hence, the transistor T is correspondingly turned off to separate the coupling charge generated when the output enable switch 508 is turned on from the input stage 502, thereby preventing the coupling charge from affecting operational voltage levels of input stage 502.

Apart from the period of transient-state change starting when the output enable switch 508 is turned on (i.e., a period outside the operational period TP), the gate voltage level of the transistor T is higher than the source voltage level (L_SB<L_SmS). Hence, the transistor T is correspondingly turned off to allow the operational amplifier 5 to function correspondingly.

The coupling effect reduction circuit according to this embodiment of the present invention applied in an operational amplifier separates voltage redistribution and charge coupling effects generated when an output enable switch is turned on/off from a part of the circuits in the operational amplifier. Compared to a conventional operational amplifier, the coupling effect reduction apparatus and operational amplifier of the present invention are advantaged by being capable of effectively separating voltage redistribution and charge coupling effects generated by switching operations of turning on and turning off an output enable switch, so as prevent the voltage redistribution and charge coupling effects from affecting a bias at an internal node of the operational amplifier.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An operational amplifier, for driving a load, comprising:
    an input stage, for providing an intermediate signal according to an input signal;
    an output stage, comprising an output node, for providing a driving signal according to the intermediate signal;
    an output enable switch, coupled between the output node and the load, being turned on during an output enable period, to drive the load with the driving signal, the output enable period having a start time point;
    an internal circuit, coupled between the input stage and the output stage; and
    a coupling effect reduction circuit, coupled between the internal capacitor and the output node or between the internal capacitor and the input stage, being turned off during an operational period that begins from the start time point, so as to prevent coupling charge generated when the output enable circuit is turned on from affecting operational voltage levels of the input stage.

2. The operational amplifier according to claim 1, wherein the coupling effect reduction circuit comprises:
    a switch unit, having a receiving end receiving a reference voltage signal, and a first input end and a second input end respectively coupled to the internal capacitor and the output node, being turned off during the operational period in response to the reference voltage signal and the driving signal at the output node.

3. The operational amplifier according to claim 1, wherein the coupling effect reduction circuit comprises:
    a control unit, for providing a control signal corresponding to a disable level during the operational period; and
    a switch unit, having a receiving end receiving the control signal, and a first input end and a second input end respectively coupled to the internal capacitor and the input stage, being turned off during the operational period in response to the control signal.

4. The operational amplifier according to claim 1, wherein the internal capacitor serves as a compensation capacitor for performing compensation on the operational amplifier.

* * * * *